(12) United States Patent
Clark et al.

(10) Patent No.: US 7,118,726 B2
(45) Date of Patent: Oct. 10, 2006

(54) METHOD FOR MAKING OXIDE COMPOUNDS

(75) Inventors: Jeffrey W. Clark, Newman Lake, WA (US); Larry B. Hunnel, Cheney, WA (US)

(73) Assignee: Clark Manufacturing, LLC, Newman Lake, WA (US)

( * ) Notice: Subject to any disclaimer, the term of this patent is extended or adjusted under 35 U.S.C. 154(b) by 454 days.

(21) Appl. No.: 10/408,673

(22) Filed: Apr. 4, 2003

(65) Prior Publication Data

US 2004/0115121 A1    Jun. 17, 2004

Related U.S. Application Data

(60) Provisional application No. 60/433,534, filed on Dec. 13, 2002.

(51) Int. Cl.
*C01G 1/00* (2006.01)
*C01G 29/00* (2006.01)

(52) U.S. Cl. .................. 423/592.1; 423/617; 423/625; 423/618; 423/622; 423/623; 423/605; 423/594.17; 423/594.18; 204/164

(58) Field of Classification Search ............ 423/592.1, 423/617, 625, 618, 622, 623, 605, 594.17, 423/594.18; 204/164
See application file for complete search history.

(56) References Cited

U.S. PATENT DOCUMENTS

| | | | |
|---|---|---|---|
| 1,300,522 A | 4/1919 | Vollkommer | |
| 1,318,336 A | 10/1919 | Ellis | |
| 1,425,918 A | 8/1922 | Thomson | |
| 1,522,096 A | 1/1925 | Breyer et al. | |
| 1,522,097 A | 1/1925 | Breyer et al. | |
| 1,522,098 A | 1/1925 | Breyer et al. | |
| 2,177,551 A | 10/1939 | Perkins et al. | |
| 3,306,760 A | 2/1967 | Zirngibl et al. | |
| 3,467,498 A | 9/1969 | Benner, Jr. et al. | |
| 3,525,595 A | 8/1970 | Zirngibl et al. | |
| 3,734,761 A | 5/1973 | Becker et al. | |

(Continued)

FOREIGN PATENT DOCUMENTS

WO    WO 99/00530 A1    1/1999

(Continued)

OTHER PUBLICATIONS

Kohlschütter, V., and J.L. Tüscher, "On Producing Disperse Substances in Gaseous Media," *Journal of Electrochemistry and Applied Physical Chemistry* 27(11/12):225-286, Jun. 1921.

(Continued)

*Primary Examiner*—Timothy C. Vanoy
(74) *Attorney, Agent, or Firm*—Christensen O'Connor Johnson Kindness PLLC

(57) ABSTRACT

A method of making an oxide compound, comprising subjecting a base material to a source of heat that produces a localized temperature in the range of 2,000 to 5,500 degrees Celsius that vaporizes the base material which is drawn upward above the surface of the base material where it oxidizes, after which the resulting oxide compound is collected. A method of making bismuth trioxide, comprising providing an electric arc between electrodes, wherein elemental bismuth is in touching proximity to one of the electrodes. The bismuth is evaporated, drawn upward off the surface of the molten metal, forms the bismuth oxide on contact with oxygen, and the particles of bismuth oxide are collected. A method of making an oxide using an electric arc to evaporate a base material which then reacts with oxygen, and collecting the resulting oxides of base material.

15 Claims, 2 Drawing Sheets

U.S. PATENT DOCUMENTS

| | | | |
|---|---|---|---|
| 4,675,171 A | | 6/1987 | Kubo et al. |
| 4,721,610 A | * | 1/1988 | Yoshida et al. ............ 423/636 |
| 4,873,073 A | | 10/1989 | Matsui et al. |
| 4,942,152 A | | 7/1990 | Itozaki et al. |
| 4,965,093 A | | 10/1990 | Neuman et al. |
| 5,236,891 A | | 8/1993 | Hikata et al. |
| 5,317,008 A | | 5/1994 | Imai |
| 5,354,535 A | | 10/1994 | Dorris et al. |
| 5,426,075 A | | 6/1995 | Perino et al. |
| 5,458,867 A | | 10/1995 | Ritter |
| 5,468,566 A | | 11/1995 | Dorris et al. |
| 5,479,140 A | | 12/1995 | Abe et al. |
| 5,508,254 A | | 4/1996 | Sato et al. |
| 5,519,566 A | | 5/1996 | Perino et al. |
| 5,610,123 A | | 3/1997 | Sato et al. |
| 5,635,154 A | * | 6/1997 | Arai et al. ................. 423/263 |
| 5,770,113 A | | 6/1998 | Iga et al. |
| 5,840,267 A | * | 11/1998 | Saegusa ................... 423/594.9 |
| 5,936,013 A | | 8/1999 | Feola et al. |
| 5,958,361 A | | 9/1999 | Laine et al. |
| 6,146,552 A | | 11/2000 | Iga et al. |
| 6,472,547 B1 | | 10/2002 | Morisawa et al. |
| 2001/0012698 A1 | | 8/2001 | Hayashi et al. |
| 2002/0055033 A1 | | 5/2002 | Yadav et al. |

FOREIGN PATENT DOCUMENTS

| | | |
|---|---|---|
| WO | WO 99/32684 A1 | 7/1999 |
| WO | WO 99/32685 A1 | 7/1999 |
| WO | WO 00/00497 A1 | 1/2000 |
| WO | WO 00/34398 A1 | 6/2000 |
| WO | WO 00/38282 A2 | 6/2000 |
| WO | WO 00/77832 A2 | 12/2000 |
| WO | WO 00/78691 A1 | 12/2000 |
| WO | WO 01/42522 A2 | 6/2001 |
| WO | WO 01/44138 A1 | 6/2001 |
| WO | WO 01/58213 A1 | 8/2001 |
| WO | WO 01/66834 A2 | 9/2001 |
| WO | WO 02/27057 A2 | 4/2002 |
| WO | WO 02/075825 A2 | 9/2002 |

OTHER PUBLICATIONS

"Bearing Materials to Carbon," *Encyclopedia of Chemical Technology*, 4th ed., 1992, vol. 4, pp. 246-270.

"Vitamins to Zone Refining," *Encyclopedia of Chemical Technology*, 4th ed., 1998, vol. 25, pp. 840-853.

*Ullmann's Encyclopedia of Industrial Chemistry*, 5th ed., Index, pp. 107, 277, 663-664; vol. A6, *Ceramics, General Survey*, p. 18; and vol. A20, *Pigments, Inorganic*, pp. 294-297, 1992.

* cited by examiner

METHOD FOR MAKING OXIDE COMPOUNDS

CROSS-REFERENCE TO RELATED APPLICATION

This application claims the benefit of the filing date of U.S. Provisional Application No. 60/433,534, filed Dec. 13, 2002.

FIELD OF THE INVENTION

The present invention relates to a process for the production of bismuth oxides through direct oxidation of elemental bismuth.

BACKGROUND OF THE INVENTION

One previous method for making oxides of bismuth included comminuting the bismuth metal into fine particles. The fine particles are subjected to a burning flame. Combustion of the bismuth particles results in bismuth oxides. The particles are collected using filters. A disadvantage to this process is the incomplete combustion of some of the larger particles leading to the formation of slag.

Another process for making oxides of bismuth included using a sealed vessel divided by a partition wall into two compartments. One of the compartments contains a furnace for heating bismuth. An inert gas is fed into this compartment to attain a specific bismuth vapor concentration. The inert gas is said to avoid the formation of oxide on the surface of the molten metal which prevents vaporization of the bismuth. The vapors then pass into the second compartment where air or oxygen enriched air is provided to form the bismuth oxides. The bismuth oxides are discharged from the sealed vessel and collected.

Another process for making oxides of bismuth includes adding a monocarboxylic acid to an aqueous solution containing trivalent bismuth ions thereby inducing formation of a bismuth monocarboxylic acid complex in the solution. Adding an alkali to the solution induces precipitation of the bismuth monocarboxylic acid complex. The precipitated complex is separated and fired at a temperature of 340° C. to 360° C. for about two to four hours to produce the bismuth oxides.

In another process of making oxides of bismuth, a nozzle is employed to direct a blast of gas at the molten metal as it is vaporized using an electric arc. Directing the gas at the surface of the molten metal causes dross to form thereon. Formation of dross is undesirable because it reduces the surface area from which vaporization of the metal can occur. In order to increase the area from which the vaporization can occur, it is suggested that the dross be scraped from the surface of the molten metal. In addition, this prior process describes producing bismuth oxide from small amounts of bismuth on the order of 3 to 4 grams.

In general, other than the wet method and the method employing an electric arc, the prior art methods of making bismuth oxide rely on low temperature conventional furnaces to heat the bismuth to the point of melting. These furnaces use heat generated by electrical resistance or combustible fuels. The earlier method lead to the formation of slag, dross, or contaminants on the surface of the molten bismuth necessitating the need for inert gases and a two-chambered vessel of the later process. The inert gases and two-chambered vessel add to the cost and complexity of making bismuth oxides. The method employing an electric arc on small quantities of metals, i.e., 3 to 4 grams, also suffers from the problems associated with dross formation.

Accordingly, there is a need for a newer method of converting bismuth to bismuth oxide on a larger scale, e.g., greater than 100 pounds of bismuth, without having any of the aforementioned drawbacks. The present invention fulfills this need and has further related advantages.

SUMMARY OF THE INVENTION

A method of making an oxide compound, comprising subjecting a base material to a source of heat that produces a localized temperature in the range of 2000 to 5500 degrees Celsius that promotes the vaporization of the base material into ambient air, and collecting the resulting oxide compound. In one embodiment, the source of heat is in touching proximity to the base material. A method of making bismuth trioxide, comprising providing an electric arc between electrodes, wherein elemental bismuth is in touching proximity to one of the electrodes. The bismuth is evaporated, the evaporated bismuth is drawn upward and forms bismuth oxide on contact with oxygen, and the particles of bismuth oxide are collected. In one embodiment, the source of heat or the electric arc is in touching proximity to the base material. A method of making an oxide using an electric arc to promote evaporation of a base material which then reacts with oxygen, and collecting the resulting oxides of base material.

The present invention provides a cost effective method for producing bismuth oxide of high purity through direct oxidation without directing gas such as air at the surface of the molten metal. The method of the present invention avoids the problems owing to dross formation encountered when gas is directed at the surface of the molten metal. The bismuth oxide is produced as a finely divided powder. The bismuth oxide is produced in a particle size of less than one micron. The average size of the particles may be less than 0.2 microns. The bismuth oxide powder made according to the present invention disperses more readily when compared to bismuth oxide made by the previous methods.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
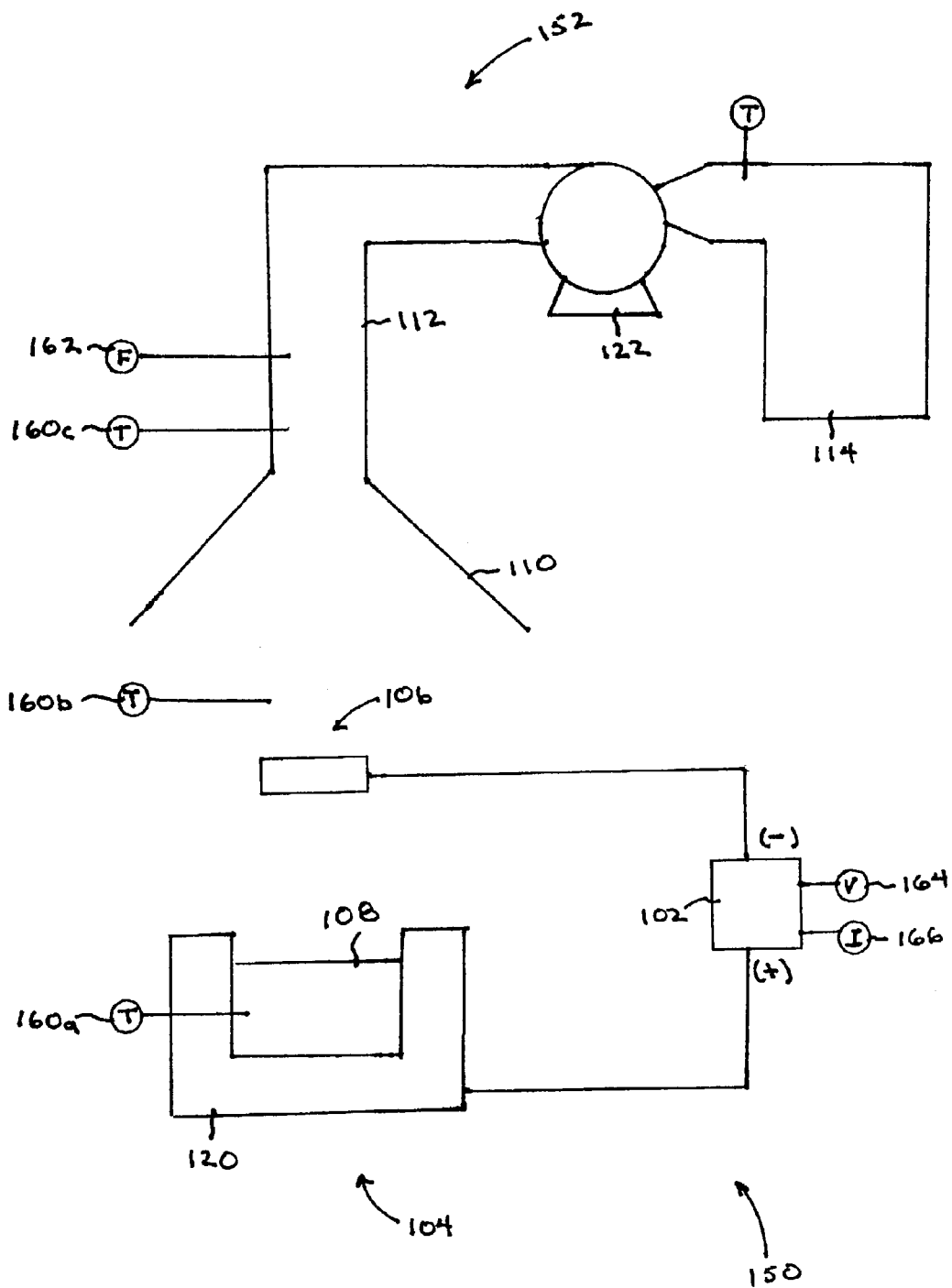
FIG. 1 is a schematic illustration of one embodiment of a system for making oxide compounds according to the present invention.

Referring now to FIG. 1, a system for making oxide compounds according to the invention includes a furnace 150 and a particle collection assembly 152. The furnace 150 will produce base material vapors. The vaporous base material oxidizes on contact with oxygen, and the particles are collected with the collection assembly. In one embodiment, the furnace 150 is an electric arc furnace and includes a direct current (DC) power supply 102 having a positive and a negative electrode 104 and 106, respectively. The power supply 102 has a voltmeter 164 and ampmeter 166 used for measuring and controlling voltage and amperage. In one embodiment of the invention, the positive electrode or cathode includes a crucible 120 that serves as a container for a molten base material 108 that is to be used to form the oxide compound from the base material. One suitable base material is bismuth. One suitable oxide produced by the method according to the present invention is bismuth trioxide, herein used interchangeably with bismuth oxide. However, this invention may be applied to the production of oxides of other class II metals, including, aluminum, tin, zinc, manganese, tellurium, iridium, cadmium, vanadium, and the like. In general, any metal that can have a vapor pressure that is approximately the pressure of the ambient conditions can be oxidized according to the present invention. The furnace 150 can be enclosed within a housing or can be open to the ambient air atmosphere. The temperature of the air available to the furnace can be allowed to vary with the room temperature.

The system is provided with a suitable vapor/particle collection assembly 152. In one embodiment of the invention, the collection system includes a vent hood 110, a blower 122, a filter 114, and a conduit 112 to connect the various components. The vent hood 110 is located a suitable distance from the furnace area 150 to collect the base material vapors. The conduit 112 connects the vent hood 110 to blower 122, and filter 114. Either a blower or a vacuum pump can be provided on the collection assembly to draw the vapors and air into the vent hood 110 and move them to the filter 114. The embodiment of FIG. 1 uses a blower 122, thereby drawing the vapors into the vent hood 110. An inlet for the blower 122 is provided a suitable distance from the intake of the vent hood 110. Additional air or quenching gas may be provided at a location on the conduit for cooling the vapors from the furnace, but it is preferred not to direct gas at the surface of the molten metal from a source such as a nozzle or jet. Effective vaporization and oxidation of the base material is achieved by the present invention without directing gas at the molten base material. Other suitable cooling methods can be used in lieu of or in addition to the system described herein, including heat exchangers, and refrigeration. In one embodiment, the conduit can be up to 20 feet in length from vent hood 110 to filter 114. However, in determining the length of the conduit, the overall system configuration must be considered. The temperatures produced by the process, the surrounding air temperature, and the amount and the temperature of the quenching gas that is supplied to the conduit are all believed to have an influence on the determination of the conduit length. Temperature sensing instruments 160A–C can be provided throughout the vapor collection assembly and in the furnace area in strategic locations to monitor temperatures and alarm at predetermined limits to maintain the process in control. Flow meters 162 can be provided at strategic locations to measure gas flows. A suitable amount of air drawn by the blower in addition to the vapor is in the range of about 100 actual cubic feet (ACF) to 500 ACF for every pound of bismuth oxide produced, depending on the particular system configuration. In one embodiment, the preferred flow rate is approximately 225 ACF for every pound of bismuth oxide produced. Such amounts of air drawn by the blower can be achieved by drawing 100–800 cubic feet/minute of air. Sufficient amounts of air should be drawn by the blower to ensure that a substantial portion of the oxidation of the vaporized molten metal occurs off of the surface of the molten material. If too little air/gas is drawn into the vent hood, the oxidation reaction occurs at the surface of the molten metal and oxide particles that form are more likely to collect on the surface of the molten metal and form dross. The ability of the collection system described above to draw vaporized metal off of the surface of the molten metal should not be compromised by disrupting the suction of the collection system by directing a blast of gas at the surface of the molten metal using a nozzle, jet or blower.

It is possible that the manner in which the vapors are cooled will have an effect on the ultimate oxide compound particle attributes. For example, rapid cooling of the vapors may impart desirable morphological characteristics to the base material oxide particle; however, in other embodiments, the delayed quenching of the vapors may impart other desirable morphological properties of the base material oxide particles. To this end, air or any other suitable quenching gas can be provided to the conduit 112 depending on the ultimate morphological properties desired of the base material oxide particle. In any event, once cooled, the base material oxide particles travel in conduit 112 and are collected in any suitable collecting device 114. One embodiment of a collecting device is a bag filter. Bag filters may be arranged in parallel or in series, and emptied on a convenient schedule. One advantage to arranging a series of filters of gradually decreasing pore size is that the particles can be collected into predetermined size ranges. In other embodiments, the filter 114 can be an electrostatic filter or an ultraviolet (UV) filter.

When bag filters are employed to collect the oxide particles, as the oxide particles begin to saturate the filters, less air is drawn through the filters until such time that an insufficient amount of air is being drawn. When this occurs, the collected oxide particles must be removed from the filters.

In one embodiment, oxygen enriched air may be added in place of atmospheric air at the conduit 112. However, any other gas mixture having a suitable amount of oxygen can be used. In other embodiments, it may be desirable to use a gas devoid of oxygen or with only a specified amount of oxygen. In other embodiments, the exposure to oxygen may occur prior to the drawing of the vapors into the vent hood 110. For example, air or oxygen may be drawn into the general area of the furnace above the surface of the molten metal. For example, by being drawn into the general area of the furnace above the molten base material as a result of the draft created by the vent hood. Drawing gas into the furnace in this manner is different from the prior processes that blow a gas obliquely at the molten metal. In accordance with the present invention, gas that is drawn into the furnace by the vent hood is not directed at the molten base material.

The present invention produces metal oxides, such as bismuth trioxide, without requiring that air or other gas be blown directly onto the surface of the molten material. Without being bound by theory, applicants believe that directing air or another gas onto the surface of the molten base material promotes the formation of dross by promoting oxidization of the vaporized metal at the surface of the melt where the oxidized particles can easily find their way back onto the surface of the melt. In addition, the applicants believe that blowing air or another gas onto the surface of the melt promotes the direct oxidation of the base material itself which results in the formation of additional dross which has the adverse effect of inhibiting the evaporation of the base material. The method of the present invention creates a volume of molten base material wherein vaporization of the base material occurs from as large a portion of the surface of the molten material as possible. The vaporization occurs from those portions of the molten material not covered by dross. Minimizing dross formation is desired in order to evaporate the base material from as large a percentage of the molten base material as possible which results in a higher rate of production.

The electric arc furnace and the generation of base material vapors may be conducted in a chamber connected to the vapor collection system, and a suitable amount of oxygen can be provided to the chamber. Depending on the apparatus configuration and availability of oxygen, oxidation may be substantially completed before the vapors enter the vent hood 110 or oxidation may be substantially completed within the conduit 112. The rate of oxidation is believed to be dependent on the particle size. Smaller particles will be oxidized quicker in comparison to larger particles, everything else being equal. The rate of oxidation is further believed to have an effect on the properties of the oxide particle compounds.

According to the invention, oxide compounds are made by subjecting a base material to a localized high temperature source sufficient to promote vaporization of the base material into the surrounding environment where it is drawn upward from the surface of the molten base material and react with oxygen in an exothermic process. The resulting oxidized base material particles are collected using any suitable means. In one embodiment of the invention, bismuth metal is oxidized to bismuth trioxide. While referring to bismuth, it is to be understood that other base materials are also included within the scope of this invention. In one embodiment, the localized high temperature is produced by an electric arc generated across an adjustable gap spacing between a cathode and anode. Crucible 104 and base material 108 can be considered part of the cathode, in that electrons flow through the crucible and base material to produce the arc. However, other methods for producing the necessary high temperatures are within the scope of this invention. Representative methods of reaching the high localized temperatures to achieve the present invention include using electric arc methods, TIG welders, focused halogen, laser, electron beam, microwave and the like. At the present time, it has been found that an electric arc provides a suitable high temperature while being simple in design and cost effective.

The base material 108 desired to be oxidized is placed in the crucible 104 either as a bar or in comminuted form. Power is initiated and an arc is produced across the cathode 104 and the anode 106. While not completely understood, it is believed that base material 108 is vaporized as ionized plasma and oxidized when it comes in contact with the oxygen of the surrounding air. The heat generated by the arc will also melt the base material forming a pool of the base material 108 within the crucible 104. For bismuth, the amperage, voltage, and gap spacing may be varied to achieve a molten bismuth temperature of about 800 to about 900 degrees Celsius at the location where the bismuth evaporates from the molten bismuth. Other embodiments may achieve the melting point or greater of the base material desired to be oxidized. To this end, temperature sensor 160*a* is provided at the crucible 104 to monitor or control molten base material temperature. An optical pyrometer is one example of a suitable temperature sensing instrument. In one embodiment, the direct current power supply while in operation is provided at about 200 to about 400 amps and about 20 to about 40 volts. For producing bismuth trioxide, the range is preferably 350 to 400 amps. However, in other embodiments, depending on the system configuration, the base material to be oxidized, the power supply can be less than 200 amps, for example, about 100 to about 200 amps, or even less than 100 amps. In other embodiments, the power supply can be greater than 400 amps, for example, about 400 to about 600 amps, or greater than 600 amps. One suitable range of the power supply voltage is in the range of about 20 to about 40 volts for the system when producing bismuth trioxide. However, again depending on the system configuration and the base material to be oxidized, less than 20 volts can be used, for example, about 10 to about 20 volts, or even less than 10 volts. Greater than 40 volts can also be used, for example, about 40 to about 60 volts, or greater than 60 volts. It is believed that the amperage and voltage used will have an effect on the ultimate properties of the oxide compound particle produced. While there are many factors affecting the morphology of the bismuth oxide particle, other factors besides those mentioned here will have an affect on the ultimate properties of the particle.

One further factor affecting the ultimate morphology of the bismuth trioxide particle is the gap spacing between the cathode and the anode. In one embodiment, during operation, the gap spacing can be from ½ inch to 3 inches. However, a gap spacing less than ½ inch may be suitable depending on other considerations of the system or the base material. A gap spacing greater than 3 inches may be suitable depending on other considerations of the system or the base material. Varying the gap spacing can reduce dross, increase production, increase yield, and contribute to the particle morphology, among having other benefits. Before, during, or after melting of the base material metal, the variables, including amperage, voltage, gap spacing, air flow, air temperature, oxygen concentration can be adjusted in order to optimize the production of the oxides.

The anode 106 and the cathode 104 are made of any suitable material, including carbon, silica, metals, including copper, gold, silver, nickel, iron, their alloys, and the like. In one embodiment, the anode 106 is made from carbon graphite material, preferably vitreous carbon. In one embodiment, the crucible at the cathode 104 is also made from graphite, preferably vitreous carbon. A cold plate or heat sink can be provided at the base of the crucible to cool portions of the base material. The power supply 102, vent hood 110, filter 114, conduit 112, and blower 122 are of conventional design and made from materials easily determined by their intended purpose from this description. However, any surface of the equipment coming in contact with the bismuth oxide is preferably coated or made from materials not prone to contaminate the bismuth oxide. Suitable materials of construction include stainless steel (316 L), TEFLON, and the like.

Further aspects of this invention are related to the materials selected for the anode and cathode. If the anode is made from carbon graphite, the anode is sacrificial. However, it is believed that carbon anodes provide benefits that improve on the aforementioned prior art processes. Without being bound by theory, it is believed that the carbon anodes lead to the formation of carbon dioxide which blankets the base material molten surface, thus, providing a blanket in proximity to the molten base material to delay the reaction of the base material with oxygen and to delay the formation of base material oxides and nitrates at the surface of the molten pool, i.e., the dross. In accordance with the present invention, it is preferred not to disrupt/break up this blanket of carbon dioxide by directing a flow of air or gas at the surface of the molten material.

Another advantage provided by the invention is the reduction of dross due to the high temperature produced by the electric arc which is also capable of evaporating the dross; thus, exposing more molten base material surface for evaporation. The present invention takes full advantage of the high temperatures produced by the electric arc and avoids directing any type of quenching gas or oxidizing gas at the surface of the molten metal. The production of carbon dioxide is also beneficial in that less contamination will be included with the collected base material oxide compound. If the anode or cathode electrodes are made from materials other than carbon, the electrode material can be found as a contaminant in the oxide compounds, whereas carbon dioxide diffuses in the air.

In a preferred aspect of the present invention, not all of the molten base material present in the crucible 120 is heated to the same temperature. For example, a portion of the molten base material need not be at the same temperature as the molten base material adjacent the arc where the evaporation is occurring. As discussed above, the molten base material adjacent the arc is at a temperature of about 800–900° C. The balance of the molten base material is cooler, e.g., at a temperature of about 300 to 500° C. This cooler volume of base material surrounds the hotter portion of the base material forming a "reservoir" around the hotter material. The advantage of maintaining this reservoir at a lower temperature is that at the lower temperatures, the molten base material has a higher conductivity compared to the conductivity of the molten base material at the higher temperatures. Accordingly, when the reservoir at the lower temperature is provided, arc formation is achieved using voltages or amperages that are lower than the voltages or amperages that would be necessary if the reservoir of molten material was at the higher temperature, e.g., 800–900° C. By controlling the temperature of the molten base material as described above, a more cost-effective process is provided. In addition to controlling the temperature of the molten base material through control of the voltage and amperage employed, the base material can be cooled. Cooling of the molten base material in the reservoir can be provided through heat transfer through the walls of the bowl shaped crucible or a cold plate or heat sink provided at the base of the crucible as described above. Other means of drawing heat away from the exterior of the crucible are also appropriate such as heat exchangers, cooling jackets, and the like.

Previous methods of making bismuth trioxide included having an inert blanketing gas introduced into a separate furnace chamber to prevent the formation of dross followed by oxidizing the bismuth vapor in a separate chamber, wherein the furnace chamber and the collection chamber were divided by a wall with an aperture therethrough providing vapor flow from the furnace chamber to the oxidizing chamber. According to the present invention, the necessity of having a two chamber apparatus with a separate source of an inert gas is eliminated by the use of the present invention, though an inert gas may be used for other purposes, including being able to control the rate of oxidation or for cooling vapors. In one embodiment of the invention, providing an inert atmosphere is thought to give rise to the formation of finely divided particles of elemental bismuth rather than the oxide which suggests a method for the production thereof.

The electric arc is believed to make contact with the base material 108 at the cathode. Temperatures in the local proximity to the electric arc or of the arc itself are estimated in the range of several thousand degrees Celsius. In any event, the arc temperature is greater than 1,250° C. It is believed that the localized temperatures of the arc can be in the range of 2000° C. to 5500° C. In some embodiments, the arc temperature may reach 2000° C. to 2800° C. However, in other embodiments, the temperature is greater than 2800° C., in some instances, reaching as high as 5500° C., or greater. For elemental bismuth and for the ranges of amperage, voltage, and gap spacing described above, the heat generated by the electric arc is sufficient to melt the bismuth, forming a pool of molten bismuth contained within the crucible 104.

Another advantage provided by the high temperatures generated by the electric arc is that slag on the surface of the molten base material will likewise be oxidized into a base material oxide. Previous methods do not achieve high enough temperatures at the surface of the molten base material to achieve this benefit, and must remove slag by raking it from the surface or otherwise removing the slag. In addition to necessitating an additional step of removing the dross, dross formation is undesirable because it reduces the surface area of the molten base material from which the metal can evaporate, which reduces the productivity of the process.

An electric arc will promote the vaporization of the base material 108. When the vaporized base material 108 comes in contact with oxygen, the oxidation of the vaporized base material proceeds exothermally and is observed as a flame or plasma. In accordance with the present invention, oxidation is seen occurring at a location remote from the surface of the molten base material, i.e., several inches above the base material surface, estimated to be at a height of at least about 1 inch, e.g., about 3 to 5 inches or more. Oxidation is visible as the base material vapors are being drawn up and into the vent hood 110 as the vapors continue reacting with oxygen present in the surrounding air. It is believed direct oxidation is an exothermic reaction. The reaction zone temperature is measured at about 1,100° C. to 1,300° C. To this end, temperature probe 160 is located at a suitable location above the furnace area to monitor the process temperature.

As noted above, in accordance with the present invention, oxidation of the base material occurs above the surface of the molten base material. Oxidation above the surface of the molten base material is promoted by operating the vent hood so that gases are drawn upward from around the periphery of the crucible and forming a vortex above the surface of the molten base material, in the absence of a jet or nozzle directing gasses at the molten base material. Drawing of gasses into the vent hood pulls vaporized metal and oxidizing gas off the surface of the molten base material allowing the exothermic reaction to occur off of the surface of the molten base material. When the oxidation reaction occurs above the surface of the molten base material, fewer oxide particles are available to find their way back onto the surface of the molten base material resulting in less undesirable dross collecting thereon. Pulling oxygen from the surface of the molten base material reduces the amount of oxygen available to oxidize the base material and form dross.

The size of the lower most portion of vent hood 110 can be chosen so that it is slightly larger than the open top of the crucible. Generally, the shape of the opening in the vent hood at its lower most extremity should match the shape of the upper surface of the crucible. For example, if the crucible is round, the lower most extremity of the vent hood can be round as well.

The spacing between the lower most extremity of the vent hood 110 and the uppermost extremity of the crucible 120 will also affect the ability of the vent hood to pull particles and gas off the surface of the vaporizing melt and promote the oxidation above the surface thereof. The spacing between the bottom of the vent hood and the top of the crucible is chosen to maximize the vaporized base material and gasses that are drawn into the vent hood. Generally, the larger the flame resulting from the oxidation reaction of the vaporized base material, the larger the amount of vaporized base material that is collected by the vent hood. Accordingly, the spacing between the bottom of the vent hood and the top of the crucible can be chosen to create as large a flame as possible above the surface of the molten material. The volume of air or gas drawn by the vent hood will also affect where the oxidation reaction occurs and can range within the values described above.

In another aspect of the invention, the gap spacing can be varied by adjusting the height of the anode 106 above the cathode 104 and in relation to the molten base material surface 108. It is believed that increasing the gap spacing leads to an increase in the temperature of the electric arc. In doing so, contaminants on the surface of the molten base material are believed to be physically repulsed away from the arc. This provides increased available area for evaporation by simply adjusting the gap spacing to determine the most suitable spacing.

In one embodiment of the invention, the pool of molten base material may be made more conductive by supplemental agents. The agents will act to increase the conductivity of the pool and accordingly will increase yield, without having any appreciable disadvantageous effect on the process. These agents include conductive salts, including sodium potassium tartrate. Additionally, water may be considered suitable as providing a source for oxygen.

Depending on the system configuration and the operating parameters, the particle attributes, including morphology, color, and size, can be varied. Amperage, voltage, air temperature, air flow rate can be varied to favor the formation of some attributes over others. In one embodiment, particles less than one micron are produced. In one embodiment, the particle is produced as a white to light yellow monoclinic crystalline solid phase. Other embodiments produce a bright yellow and orange pseudocubic crystal solid phase particle. In one embodiment, increasing the molten base material temperature to about 2,000° C. and/or supplying greater amounts of oxygen than can be supplied by the ambient air alone can provide the bright yellow to orange pseudocubic crystal forms. It is believed that white particles that have been noted collecting on the vent hood have unique morphological features, which have not been produced by any other method. To date, some features of the particles have not been characterized, but nonetheless are inherently present with this description of the method used to produce the particles.

Bismuth trioxide made according to the invention can be used in ceramics, pharmaceuticals, semiconductors, window defrosters, oxygen sensors, optical products, and electrical components, including thermisters, to name but a few applications. The bismuth trioxide of the invention is of particularly pure composition and of small particulate size to be desirable in many applications. The small size is believed to contribute to its ability to disperse readily. The bismuth trioxide particle made according to the invention can also be used in applications that currently require the use of bismuth trioxide that is not made according to this invention.

The composition of the starting elemental base material will have an influence on the purity of the final oxide compound purity. Because of the availability of very pure elemental bismuth, bismuth trioxide is produced having a purity on the order of 99.9999%, or can be even greater with the use of high purity bismuth metal and high purity electrodes.

EXAMPLE

A Representative Method for Making Bismuth Trioxide

Figure 2:
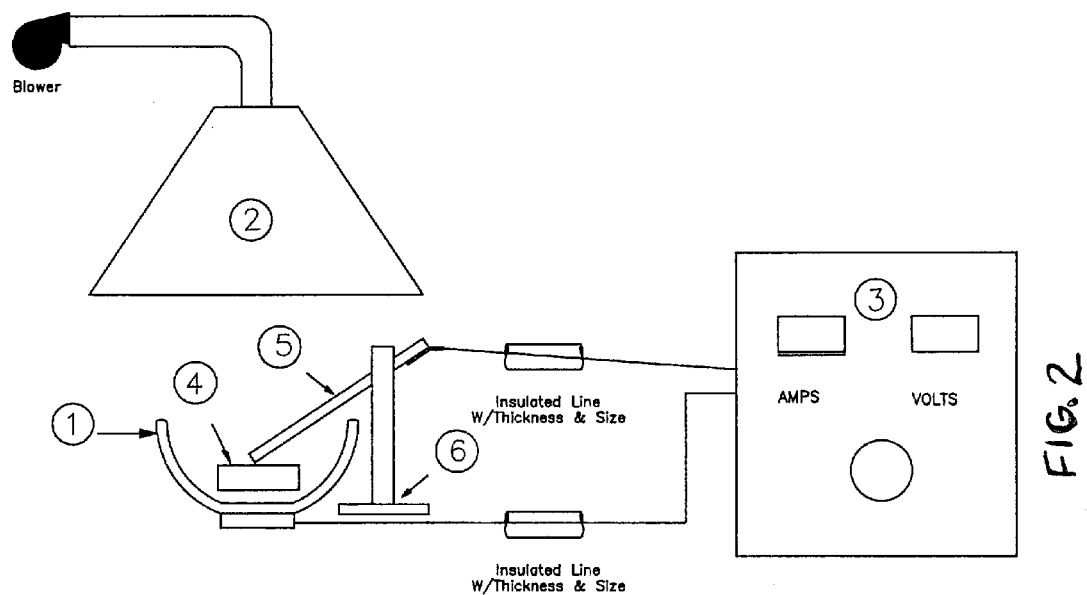
FIG. 2 is a schematic illustration of one embodiment of a system for making oxide compounds according to the present invention.

Referring to FIG. 2, a vitreous carbon crucible 1 was placed under a fume hood 2. The crucible 1 was wired to the positive side of a power supply 3. The crucible is 18 inches in diameter at its top. The power supply is a commercial device known as Lincoln Commander 300, supplied by Lincoln Manufacturing. The power supply 3 was capable of 400 amps. A 300–400 pound bar of elemental bismuth metal 4 was placed in the crucible 1. An electrode rod or bar 5 made from vitreous carbon was wired to the negative side of the power supply 3 and placed in a holder 6 with about a ½ inch to 3 inch gap between the crucible 1 and the electrode 5. The fume hood 2 and bag filter 7 were turned on. The power supply 3 was turned on and adjusted to 350–400 amps to create an arc. The arc provided the heat necessary to melt the bismuth metal bar. The power supply amperage was adjusted to maintain the molten bismuth adjacent to the arc at a temperature of 800° C.–900° C. as measured by an optical pyrometer. The gap between the negative electrode 5 and the crucible 1 was adjusted after melting the bismuth bar. The gap was varied to attain the largest possible dross-free surface area for evaporation from the molten bismuth pool. The surface areas from which evaporation occurs is the portion of the surface of the molten bismuth that is free of dross. In this Example an open area free of dross having a diameter of 2 to 4 inches was achieved. The bismuth metal evaporated and was drawn upward into the ambient atmosphere where oxidized in the absence of a flow of air or gas directed at the surface of the molten material. At about 5 inches above the crucible 1 the oxidation reaction between the bismuth vapor and the oxygen in the air proceeded exothermically, as evidenced by a flame or plasma. The approximately 1,200° C. to 1,300° C. temperature of the oxidation reaction zone was measured using the optical pyrometer. The bismuth oxide product was drawn into the fume hood provided with a flow rate of 150 to 800 cubic feet/minute of ambient air. The bismuth oxide particles were trapped using bag filters after having passed through a sufficient length of ducting to allow the particles to cool. Finely divided bismuth oxide powder was recovered. The bismuth oxide is white to light yellow in color with a crystalline form that is monoclinic. Increasing the molten bismuth metal temperature to about 2,000° C. and providing oxygen to the reaction area can form a bright yellow to orange pseudocubic crystal. The particle size of the bismuth oxide is less than 1 micron. The purity of the product is thought to depend, at least in part, upon the purity of the vitreous carbon used for the electrodes and the purity of the starting bismuth metal. Vitreous carbon is commercially available with less than 1 ppm contamination. Accordingly, it may be possible to produce bismuth oxide with less than 1 ppm of other substances, or less than 100 ppb or less than 10 ppb.

Unlike prior processes which were limited in the amounts of base material which they could vaporize, the present invention is capable of melting and vaporizing amounts of base material greater than about 100 pounds. Suitable results have been achieved by melting and vaporizing 300–500 pounds or more of base material.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for producing particles of bismuth oxide comprising:
   heating bismuth with an electric arc to produce liquid bismuth;
   evaporating bismuth vapor from a surface of the liquid bismuth in the absence of a gas being directed at the surface of the liquid bismuth;
   drawing the bismuth vapor from the surface of the liquid bismuth;
   reacting the bismuth vapor with oxygen to form particles of bismuth oxide at a location remote from the surface of the liquid bismuth.

2. The method of claim 1, wherein the liquid bismuth is evaporated into an oxygen containing environment.

3. The method of claim 1, wherein the location remote from the surface of the liquid bismuth is at least one inch above the surface of the liquid bismuth.

4. The method of claim 1, wherein the electric arc is provided between a first electrode and a second electrode, wherein the first electrode comprises a container for the liquid bismuth.

5. The method of claim 4, wherein the container is made of a carbon graphite material.

6. The method of claim 5, wherein the second electrode comprises a carbon graphite rod.

7. The method of claim 1, wherein the liquid bismuth comprises a first portion adjacent the electric arc at a temperature of about 800 to 900 degrees Celsius and a second portion surrounding the first portion at a temperature of about 300 to 500 degrees Celsius.

8. A method for producing particles of a metal oxide comprising:
   heating a metal with an electric arc to produce a liquid metal;
   evaporating metal vapor from a surface of the liquid metal in the absence of a gas being directed at the surface of the liquid metal;
   drawing the metal vapor from the surface of the liquid metal;
   reacting the metal vapor with oxygen to form particles of metal oxide at a location remote from the surface of the liquid metal; and
   cooling a portion of the liquid metal.

9. The method of claim 8, wherein the liquid metal is evaporated into an oxygen containing environment.

10. The method of claim 8, wherein the location remote from the surface of the liquid metal is at least one inch above the surface of the liquid metal.

11. The method of claim 8, wherein the metal is bismuth and the metal oxide is bismuth oxide.

12. The method of claim 11, wherein the liquid metal comprises a first portion adjacent the electric arc at a temperature of about 800 to 900 degrees Celsius and a second portion surrounding the first portion at a temperature of about 300 to 500 degrees Celsius.

13. The method of claim 8, wherein the electric arc is provided between a first electrode and a second electrode, wherein the first electrode comprises a container for the liquid metal.

14. The method of claim 13, wherein the container is made of a carbon graphite material.

15. The method of claim 14, wherein the second electrode comprises a carbon graphite rod.

* * * * *